, 
United States Patent [19]

Jarry et al.

[11] Patent Number: 4,683,163

[45] Date of Patent: Jul. 28, 1987

[54] VITREOUS SEMICONDUCTOR SUPPORTING STRUCTURE AND DEVICE REALIZED WITH SUCH A STRUCTURE

[75] Inventors: Philippe Jarry, Sucy-en-Brie; Mohamed L. Haji, Lannion; Pierre Guittard, Montlhery Longpont; Bernard Guillemet, Vitry-sur-Seine; Claude Piaget, Montgeron, all of France

[73] Assignee: U.S. Philips Corporation, New York, N.Y.

[21] Appl. No.: 661,501

[22] Filed: Oct. 16, 1984

[30] Foreign Application Priority Data

Oct. 19, 1983 [FR] France ................. 83 16636

[51] Int. Cl.[4] ................. D32B 17/06; C03C 3/14
[52] U.S. Cl. ................. 428/209; 428/210; 428/901; 428/426; 428/427; 428/428; 428/432
[58] Field of Search ............. 428/209, 210, 426, 901, 428/427, 428, 432

[56] References Cited

U.S. PATENT DOCUMENTS

| | | |
|---|---|---|
| 3,446,695 | 5/1969 | Janakirama-Rao ............. 428/432 X |
| 4,256,796 | 3/1981 | Hang et al. ............. 428/210 |
| 4,299,873 | 11/1981 | Ogihara et al. ............. 428/210 X |
| 4,311,743 | 1/1982 | Kasper et al. ............. 428/432 X |
| 4,330,596 | 5/1982 | Van Assche ............. 428/432 X |
| 4,369,220 | 1/1983 | Prabhu et al. ............. 428/210 X |
| 4,424,251 | 1/1984 | Sugishita et al. ............. 428/901 X |
| 4,491,622 | 1/1985 | Butt ............. 428/432 X |
| 4,536,435 | 8/1985 | Utsumi et al. ............. 428/210 X |
| 4,582,745 | 4/1986 | Schnable ............. 428/428 X |

Primary Examiner—Nancy A. Swisher
Attorney, Agent, or Firm—Robert J. Kraus

[57] ABSTRACT

A vitreous semiconductor supporting structure obtained by connecting semiconductor layers to a vitreous support constituted by at least two glasses. The semiconductor layers are constituted by an electrically and optically active n-ary III-V compound layer (3) and optional complementary layers for passivation (4), index adaptation (6), and protection (7). To keep the active layer in a compression state and optimize its electrical properties, the structure includes at least two glasses, an intermediate glass (15) providing thermoelastic properties and a supporting glass (16) providing a high softening temperature.

8 Claims, 3 Drawing Figures

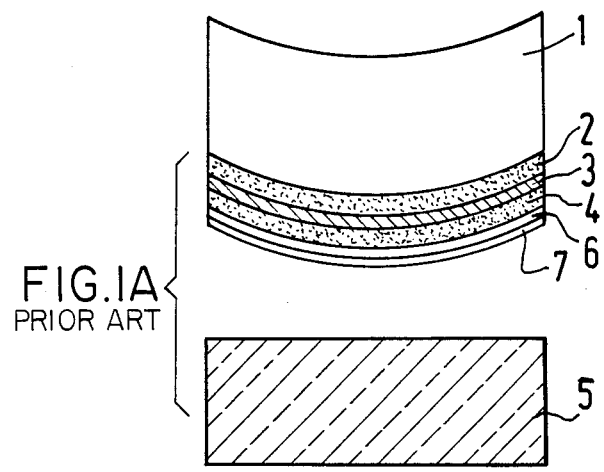
FIG.IA
PRIOR ART
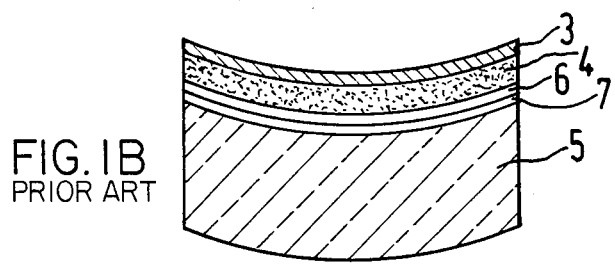
FIG.IB
PRIOR ART
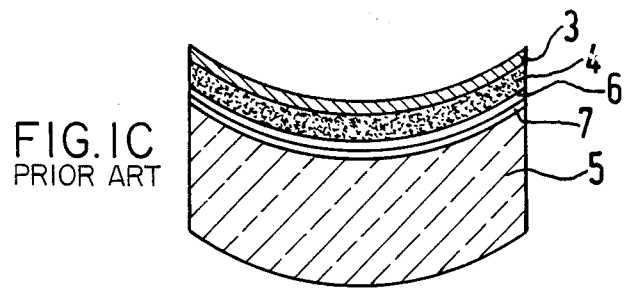
FIG.IC
PRIOR ART

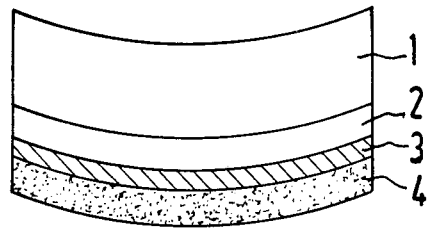
FIG.2A
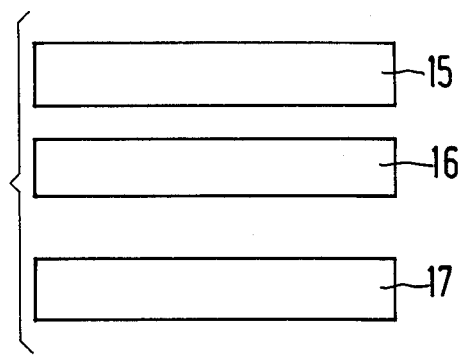
FIG.2B
FIG.2C FIG.2E
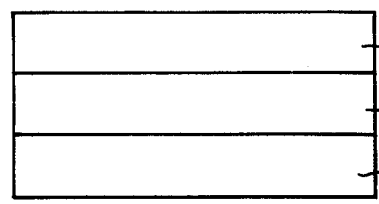 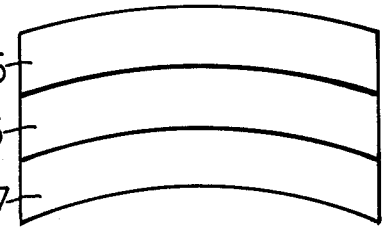
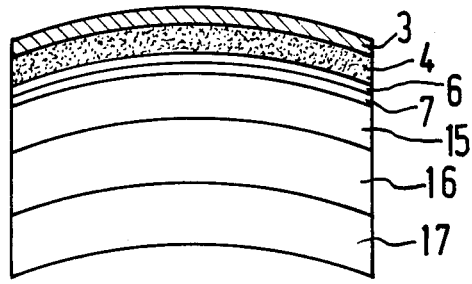
FIG.2D

VITREOUS SEMICONDUCTOR SUPPORTING STRUCTURE AND DEVICE REALIZED WITH SUCH A STRUCTURE

BACKGROUND OF THE INVENTION

The invention relates to a vitreous semiconductor supporting structure formed by a vitreous support bearing including semiconductor layers including at least a layer of an n-ary III-V compound, electrically and/or optically active, and a complementary layer.

The invention relates particularly to opto-electronic devices including semiconductors, that is to say devices permitting the manipulation (transmission, treatment and storage) of optical information, by means of an electronic assembly in which the semiconductors serve to convert photons to or from electrons. The invention relates more particularly to photocathodes of the III-V type, as well as to charge transfer devices (CCD for "charge-coupled device").

In these types of optoelectronic devices the semiconductors are provided in the form of a stack of semiconductor layers. Because the semiconductor layers are sealed to a vitreous support at comparatively high temperatures, thermal stresses develop causing bending of the semiconductor layers. The stresses may lead to the degradation of the electric qualities of the semiconductor and fracture of the active material, which is detrimental to the operation of the devices.

SUMMARY OF THE INVENTION

It is an object of the invention to mitigate the above disadvantages by a better adaptation between the semiconductor layers and the vitreous support.

Such a vitreous semiconductor supporting structure is described in French Patent Application No. 82 21 636 filed by Applicants on Dec. 23, 1982. It is suggested in the Patent Application to control the development of stresses in the active layer by introducing in certain of the complementary layers initially formed by (Ga, Al)As, a certain quantity of phosphor in order to form the quaternary compound (Ga, Al) (As, P), (which metallurgists considers as a pseudo-binary III-V compound), the object being to make the active layer pass from an expansion state to a compression state. However, the control of the different growth parameters may turn out to be difficult in certain circumstances. The present invention also proposes to preserve the usual structure of the semiconductor layers and to control their state of compression-expansion at the level of the vitreous support.

In accordance with the present invention, the coefficient of expansion of the n-ary III-V compound is higher than the (apparent) coefficient of expansion of the complementary layer(s), and the vitreous support (which permits control of the state of compression-expansion of the said semiconductor layers over a large temperature range) is formed by at least two different glasses soldered together, namely:

(a) a supporting glass having a coefficient of expansion and a softening temperature which is higher than the (apparent) coefficient of expansion of the complementary layer(s) and that the temperatures of treatment of the structure, respectively, after it has been realized, (b) an intermediate glass placed between the supporting glass and the complementary layer(s), having a softening temperature which is lower than that of the supporting glass.

In this manner a vitreous semiconductor supporting structure is obtained for which the expansion stresses of the active layer are brought back to a compression state by the action of the vitreous support, without action of the new semiconductor layers, the stresses having values such that the deformations are of an elastic type for conditions similar to those of the ambient temperature.

BRIEF DESCRIPTION OF THE DRAWING

The invention will now be described in greater detail, by way of example, with reference to the accompanying drawing in which FIG. 1 shows the various stages of manufacture, sealing and annealing of a prior art vitreous semiconductor supporting structure.

FIG. 2 shows the same steps according to the present invention, the vitreous support being constituted by three glasses sealed together. FIGS. 2C and 2E show the vitreous supports having symmetrical and dissymmetric structures, respectively.

DESCRIPTION OF THE PREFERRED EMBODIMENTS

Figure 3:
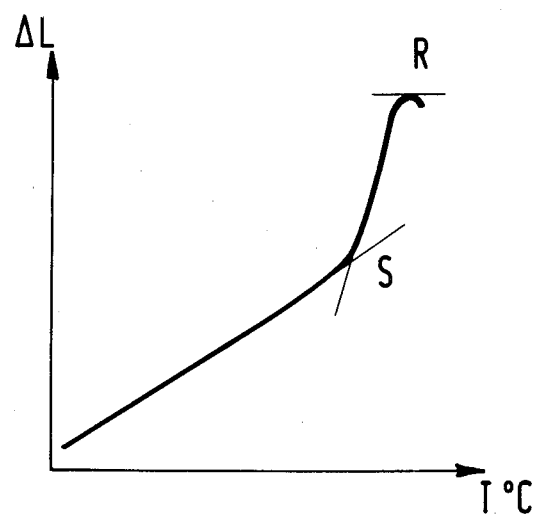
FIG. 3 shows the evolution of the coefficient of thermal expansion with the temperature for an annealing glass given by way of reference.

A typical example of a vitreous semiconductor supporting structure is constituted by the cathode III-V as described in French Patent Application No. 82 21 636 filed by Applicants on December 23, 1982.

The manufacture of such a structure comprises steps to form a semiconductor heterostructure, to bond it to a vitreous support, and finally to thermally treat the structure in a vacuum, the steps being described with reference to FIGS. 1A, B, C.

The manufacture of a semiconductor heterostructure (FIG. 1A) consists of growing, typically by liquid phase epitaxy, on a temporary substrate 1 of a III-V compound, for example gallium-aresenide (GaAs), a layer 2 termed a chemical stop layer $Ga_{1-x}Al_xAs$, which serves as a stop layer with respect to the action of the etching solution used to remove the temporary substrate 1. A thickness of the stop layer 2 on the order of 0.5 to 5 $\mu$m has given satisfactory results. A so-called active layer 3 is generally grown from gallium arsenide strongly doped (up to $10^{19}$ atoms/cm$^3$, for example) with germanium (Ge) or zinc (Zn) or a combination of doping materials, which permits growing the active layer without adversely influencing the crystal quality of the layer, as described in French Patent Application No. 82-18-255 filed in the name of Applicants on Oct. 29, 1982. A thickness of the active layer 3 on the order of 2 to 5 $\mu$m seems to be suitable for an application as a photocathode. Finally a so-called passivating layer is formed to prevent the diffusion of undesirable substances into the active layer 3 during the later steps of sealing, and to diminish the recombination of the charge carriers at the interface. A passivating layer 4 of $Ga_{1-y}Al_yAs$ having a thickness on the order of 5 $\mu$m will suffice for such use.

The distribution and the development of stresses in such a heterostructure are comparatively complex. Since the lattice constants of the crystal gallium arsenide (GaAs) and gallium aluminium arsenide ($Ga_{1-x}Al_xAs$) are substantially equal at the growth temperature, the heterostructure at such temperature (800° C.)

is without stresses. However, becausae at ambient temperature, the lattice constant of GaAs is lower than that of $Ga_{1-x}Al_xAs$, and because the thickness of the temporary substrate 1 is much higher than that of the epitaxial layers 2, 3 and 4, the active layer 3 is forced to distort. This results in a convex curvature of the assembly, viewed from the free surface of the layer 4.

The semiconductor heterostructure, after the addition of a protection layer 7 and an index adaptation layer 6 is attached to a vitreous support which is transparent to photons, to obtain a photocathode operating in transmission (FIG. 1B). The vitreous support generally is a borosilicate glass 5 such as the "CORNING" glass identified by reference number 7056. Attachment is achieved by thermocompression while raising the temperature just below its softening temperature (towards 700° C. for the 7065 glass) and maintaining the assembly under a pressure on the order of 10 kg/cm² for the time necessary for the attachment to be completed. The thickness of the vitreous support is not very critical and may be on the order of 1 to 10 mm. Once attachment is completed, the temporary substrate 1 and the stop layer 2 are etched away by means of two different etching solutions; in the example described the temporary substrate 1 of GaAs is etched away by means of a mixture of ammonia and hydrogen peroxide, while the stop layer 2 (which is insensitive to the first etching solution) is removed by means of hydrofluoric acid, after protection of the vitreous support. The product obtained comprises a vitreous support 5 serving as an input window, an index adaptation layer 6 of $Si_3N_4$, a protection layer 7 of $SiO_2$, a passivating layer 4, and an active layer 3 of a very good quality. The index adaptation layer 6 of $Si_3N_4$, the protection layer 7 of $SiO_2$, and the passivating layer 4 constitute in the present case the complementary layers the number and the composition of which may be modified as a function of the application.

During sealing at the softening temperature of the glass, the structure is practically without stress. During cooling, the semiconductor heterostructure is attached to the glass (the coefficient of expansion of which is lower than those of the various semiconductor layers) in such manner that the semiconductor layers are distorted. Removing the temporary substrate 1 and the stop layer 2 may further modify the stresses.

Finally, before using the vitreous semiconductor supporting structure as a photocathode, desorption in a vacuum of the surface of the GaAs active layer is carried out, by heating the active layer to a temperature near the evaporation point of the compound of which it is formed. For GaAs this temperature is near 630° C.

At the desorption temperature the active semiconductor layer 3 of GaAs experiences a diminished effect of the stresses due to elastic deformations of GaAs and (Ga, Al)As, respectively. At the transformation temperature of the glass phase the semiconductor heterostructure is again rigidly attached to the glass and the active layer is again distorted.

From a purely mechanical point of view it is well known that the materials better resist the stresses of compression than the stresses of expansion. The latter produce sliding dislocations, microfractures, etc . . . , while the former produce fewer defects.

From an electronic point of view the crystal defects are both traps for the charge carriers and recombination centres. The effective diffusion length of the charge carriers drops considerably when the trap density increases.

It is the object of the invention to reduce the occurrence of crystal defects due to mechanical stresses and to thus optimize the performance of the semiconductor devices formed by the semiconductor layers.

According to the present invention, as described with reference to FIG. 2, the vitreous support is constituted by at least two glasses sealed together in order to keep the active semiconducter layer 3 in a compression state, thereby avoiding the degradation of its electrical properties at least with respect to the diffusion length of the charge carriers.

The glasses are amorphous substances which, unlike crystalline substances having properties such as melting points) which vary abruptly with temperature, have properties which vary continuously with temperature. The complex characteristics of glass leads physicists to define a certain number of transition points as a function of the temperature based essentially on the viscosity of the glass $\eta$. The scale of the parameter $\eta$ defining the viscosity being large, the measured parameters are generally expressed as a function of the logarithm of $\eta$.

When $\log \eta > 15$ it concerns the solid domain.

When $8 \leq \log \eta \leq 15$ it concerns the transformation domain.

When $\log \eta < 8$ it concerns the liquid domain.

Among the various recorded temperatures, those which concern the present invention are:

the temperature at which $\log \eta = 14.5$ (that is the temperature at which the internal stresses of the glass relax in the course of 4 hours);

the annealing temperature at which $\log \eta = 13.0$ (that is the temperature at which the inner stresses of the glass are nearly completely relaxed in the course of 15 minutes); and the softening temperature at which $\log \eta = 7.6$ (that is the temperature at which the glass can be bent).

In order to characterize the thermoviscous properties of the glasses the change in the coefficient of linear expansion with temperature is considered. As is indicated in FIG. 3, representing the case of an annealing glass, two particular points S and R are defined. Point S corresponds to the growth point of the tangent at the two inflection points of the curve shown. It is termed the transformation temperature for which $\log \eta = 13.3$. Point R is the dilatometric softening point which corresponds to the beginning of weakening of the glass for which $\log \eta = 15$.

In the structure produced by epitaxial growth of the layers onto the temporary substrate 1, the part of the structure constituted by the active layer 3 of GaAs is naturally brought into the expansion state taking into account the respective coefficients of linear expansion:

$$\alpha(GaAs) = 74.6 \times 10^{-7} °C.^{-1}$$

$$\alpha(Ga_{0.5}Al_{0.5}As) = 63.3 \times 10^{-7} °C.^{-1}$$

and taking into account the fact that the passivating layer has a thickness larger than that of the active layer.

As far as the coefficients of expansion are concerned the thermoelastic properties of the vitreous support are to be adapted to the thickest complementary layer, in the present case the passivating layer 4. However, if intermediary complementary layers exist, the index adaptation layer 6 of $Si_3N_4$ and the protection layer 7 of $SiO_2$ in the present case, it is necessary to consider the affect that they have and to evaluate an apparent coefficient of expansion for the assembly of the complementary layers.

In the preferred embodiment of the invention, the semiconductor layers (in the order of occurrence) after obtaining the so-called inverted structure, are constituted by the stack of the following semiconductor layers:

$$GaAs/(Ga, Al)As/Si_3N_4/SiO_2.$$

The layers of $Si_3N_4$ and $SiO_2$ (having a thickness of approximately 1000 Å each) have respectively a role of anti-reflective layer and protection layer and have a negligible affect on the distribution of the stresses.

Dependent on its composition the coefficient of expansion of the passivating layer of (Ga, Al)As will be situated between:

$$\alpha = 74.6 \cdot 10^{-7}/°C. \text{ for GaAs}$$

and $$\alpha = 52.0 \cdot 10^{-7}/°C. \text{ for AlAs.}$$

It is desirable for the coefficient of expansion of the glass used to be higher than that of the layer of (Ga, Al)As, over the whole temperature range, so that the stresses in the semiconductor be compensated, and also that the softening temperature of the glass is not too high; otherwise the stresses produced after cooling will be high.

Contradictory requirements are demanded of the vitreous support. Thus the supporting substrate is formed from at least two different glasses. An intermediate glass layer 15 provides its thermoelastic properties, and a supporting glass layer 16 provides its softening temperature.

In order to use a vitreous semiconductor supporting structure as a photocathode, it is necessary to subject it to a surface treatment comprising a desorption in a vacuum at a temperature near 630° C. succeeded by a coating treatment by caesium oxide, in a vacuum, at ambient temperature to reduce the starting work function. However, in order not to contaminate the active semiconductor layer thus cleaned it is necessary for the treatment to be carried out rapidly, that is to say within approximately 30 minutes. Ideally this procedure should be carried out in successive temperature steps, well controlled by glass technicians to control the stresses developed in the semiconductor layers. However this is not practical in manufacturing, and is avoided in accordance with the invention by the use of at least two different glasses.

The complementary layer which, in the present example, imposes its characteristics of expansion on the vitreous support is the layer of (Ga, Al)As with a behaviour of AlAs near 0.5 for which the coefficient of expansion is approximately $63 \times 10^{-7}/°C$. In order to bring the active semiconductor layer 3 in a state which tends towards compression it is necessary for the intermediate glass 15 to have a coefficient of expansion lower than that of the active semiconductor layer 3 but with a softening temperature which is lower than or equal to the desorption temperature in a vacuum of 630° C. Also it is necessary for the supporting glass 16 to have an annealing temperature near the desorption temperature in a vacuum of 630° C. Consequently, these different necessities impose that the vitreous support be formed:

(a) by a supporting glass having a coefficient of expansion and a softening temperature higher, respectively, than the (apparent) coefficient of expansion of the complementary layer(s) and than the temperatures of treating the said structure after it has been realized, (b) by an intermediate glass placed between the supporting glass and the semiconductor layers having a softening temperature lower than that of the supporting glass.

In the examples described according to the invention a combination of three different glasses may be used. Table I summarizes their characteristics.

TABLE I

|  | CORNING Glass no. 7056 | Ca B Al Si | SCHOTT Glass no. 8436 |
|---|---|---|---|
| Coefficient of expansion | $51.5 \times 10^{-7}/°C.$ | $60.1 \times 10^{-7}/°C.$ | $66 \times 10^{-7}/°C.$ |
| Stress temperature | 472° C. | 600° C. |  |
| Annealing temperature | 512° C. | 630° C. | 630° C. |
| Transformation temperature |  |  | 620° C. |
| Softening temperature | 475° C. | 520° C. | 620° C. |

Consequently, the intermediate glass 15 could be the CORNING glass No. 7056 or the glass CaBAlSi the composition of which in mol percent is given by:

CaO 20 to 30%-$B_2O_3$ 50 to 60%-$Al_2O_3$ to 10%-$SiO_2$ 10 to 15%.

The supporting glass 16 could be the SCHOTT glass no. 8436 or the same glass CaBAlSi. Thus possible combinations of intermediate glass/supporting glass are:

CORNING glass no. 7056/SCHOTT glass no. 8436, and

CaBAlSi/SCHOTT glass no. 8436

However, the difference in coefficients of thermal expansion between the intermediate glass 15 and the supporting glass 16 produce stresses which can be reduced by a second embodiment.

On the face of the supporting glass 16 opposite to that where the intermediate glass 15 is sealed, a third glass 17 is soldered in order to counteract the stresses established by the supporting glass 16. In this manner a vitreous support comprising intermediate glass/supporting glass/third glass may be formed by:

CORNING glass no. 7056/SCHOTT glass no. 8436/CORNING glass no. 7056, or

CaBAlSi/SCHOTT glass no. 8436/CaBAlSi, or

CaBAlSi/SCHOTT glass no. 8436/CORNING glass no. 7056

It will be obvious that other glass compositions may be used to the extent where they correspond to the characteristics of the present invention.

What is claimed is:

1. In combination, a vitreous support structure and a plurality of layers bonded to and supported on said support structure, said supported layers including at least one semiconductor layer consisting essentially of an n-ary III-V compound and at least one complementary layer, characterized in that:

(a) the at least one semiconductor layer has a coefficient of expansion which is higher than that of the at least one complementary layer; and (b) the vitreous support structure comprises an arrangement of supporting layers for limiting thermally-developed stresses in the at least one semiconductor layer over a temperature range extending from ambient to the highest manufacturing temperature to which the combination is subjected, said arrangement of supporting layers including:

(1) a first glass layer having a coefficient of expansion which is higher than the coefficient of expansion of the at least one complementary layer, and having a softening temperature which is higher than said highest manufacturing temperature; and (2) a second glass layer disposed between the first glass layer and the supported layers, said second glass layer having a softening temperature which is lower than the softening temperature of the first glass layer.

2. A combination as in claim 1 where the first glass layer has a coefficient of expansion of approximately $66 \times 10^{-7}/°$ C. and a softening temperature of approximately 620° C., and where the second glass layer has a coefficient of expansion of approximately $51.5 \times 10^{-7}/°$ C. and a softening temperature of approximately 475° C.

3. A combination as in claim 1 where the first glass layer has a coefficient of expansion of approximately $66 \times 10^{-7}/°$ C. and a softening temperature of approximately 620° C., and where the second glass layer has a coefficient of expansion of approximately $60.1 \times 10^{-7}/°$ C. and a softening temperature of approximately 520° C.

4. A combination as in claim 1 where the arrangement of supporting layers includes first, second and third glass layers, the second and third glass layers being disposed on opposite sides of the first glass layer;

said first glass layer having a coefficient of expansion of approximately $66 \times 10^{-7}/°$ C. and a softening temperature of approximately 620° C.;

said second glass layer having a coefficient of expansion of approximately $51.5 \times 10^{-7}/°$ C. and a softening temperature of approximately 475° C.; and said third glass layer having a coefficient of expansion and a softening temperature substantially identical to that of said second glass layer.

5. A combination as in claim 1 where the arrangement of supporting layers includes first, second and third glass layers, the second and third glass layers being disposed on opposite sides of the first glass layer;

said first glass layer having a coefficient of expansion of approximately $66 \times 10^{-7}/°$ C. and a softening temperature of approximately 620° C.;

said second glass layer having a coefficient of expansion of approximately $60.1 \times 10^{-7}/°$ C. and a softening temperature of approximately 520° C.; and said third glass layer having a coefficient of expansion and a softening temperature substantially identical to that of said second glass layer.

6. A combination as in claim 1 where the arrangement of supporting layers includes first, second and third glass layers, the second and third glass layers being disposed on opposite sides of the first glass layer;

said first glass layer having a coefficient of expansion of approximately $66 \times 10^{-7}/°$ C. and a softening temperature of approximately 620° C.;

said second glass layer having a coefficient of expansion of approximately $60.1 \times 10^{-7}/°$ C. and a softening temperature of approximately 520° C.; and said third glass layer having a coefficient of expansion of approximately $51.5 \times 10^{-7}/°$ C. and a softening temperature of approximately 475° C.

7. A combination as in claim 1, 2, 3, 4, 5 or 6, said combination comprising a photocathode.

8. A combination as in claim 1, 2, 3, 4, 5 or 6, said combination comprising a charge transfer device.

* * * * *